US008486796B2

(12) United States Patent
Harmon et al.

(10) Patent No.: US 8,486,796 B2
(45) Date of Patent: Jul. 16, 2013

(54) THIN FILM RESISTORS AND METHODS OF MANUFACTURE

(75) Inventors: David L. Harmon, Essex, VT (US); Joseph M. Lukaitis, Pleasant Valley, NY (US); Stewart E. Rauch, III, Poughkeepsie, NY (US); Robert R. Robison, Colchester, VT (US); Dustin K. Slisher, Wappingers Falls, NY (US); Jeffrey H. Sloan, Chittenden, VT (US); Timothy D. Sullivan, Franklin Lakes, NJ (US); Kimball M. Watson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 12/950,635

(22) Filed: Nov. 19, 2010

(65) Prior Publication Data
US 2012/0126370 A1 May 24, 2012

(51) Int. Cl.
*H01L 21/8222* (2006.01)
*H01L 23/62* (2006.01)

(52) U.S. Cl.
USPC ........... 438/330; 438/382; 257/359; 257/380; 257/E27.113; 257/E27.114

(58) Field of Classification Search
None
See application file for complete search history.

(56) References Cited

U.S. PATENT DOCUMENTS

| 2,915,684 | A | 12/1959 | Halla et al. | |
|---|---|---|---|---|
| 5,812,374 | A | 9/1998 | Shuff | |
| 5,841,340 | A | 11/1998 | Passaro, Jr. et al. | |
| 6,728,104 | B1 | 4/2004 | Ahmad et al. | |
| 7,345,364 | B2 | 3/2008 | Kerr et al. | |
| 7,846,783 | B2 * | 12/2010 | Mehrotra et al. | 438/142 |
| 2002/0180063 | A1 * | 12/2002 | Iwaki et al. | 257/778 |
| 2005/0161767 | A1 * | 7/2005 | Sugihara | 257/536 |
| 2006/0267202 | A1 * | 11/2006 | Matsuzaki | 257/758 |
| 2010/0032770 | A1 * | 2/2010 | Park et al. | 257/379 |

FOREIGN PATENT DOCUMENTS
EP          1681720 A2          7/2006

* cited by examiner

*Primary Examiner* — Alonzo Chambliss
(74) *Attorney, Agent, or Firm* — David Cain; Roberts Mlotkowski Safran & Cole, P.C.

(57) ABSTRACT

A method of forming a semiconductor structure includes: forming a resistor over a substrate; forming at least one first contact in contact with the resistor; and forming at least one second contact in contact with the resistor. The resistor is structured and arranged such that current flows from the at least one first contact to the at least one second contact through a central portion of the resistor. The resistor includes at least one extension extending laterally outward from the central portion in a direction parallel to the current flow. The method includes sizing the at least one extension based on a thermal diffusion length of the resistor.

19 Claims, 11 Drawing Sheets

THIN FILM RESISTORS AND METHODS OF MANUFACTURE

FIELD OF THE INVENTION

The invention relates to semiconductor structures and methods of manufacture and, more particularly, to thin film resistors for reduced heating and methods of manufacture.

BACKGROUND

Precision resistors are in general use in Si-based microelectronics integrated circuit chips. These resistors are frequently fabricated from polysilicon layers deposited on the chip, but they can also be made from diffused silicon (Si) layers in silicon-on-insulator (SOI) wafers, or from refractory metal layers such as TaN or TiN. The resistor materials are generally high in electrical resistivity, and their total resistance is controlled by the film thickness and the width and length of the rectangular film segment that is used. The resistance is given by R=rho*l/A, where rho is the electrical resistivity, l is the length (direction parallel to the current flow) of the rectangle, and A is the cross-sectional area (thickness times width). In the case of Si resistors, the resistivity can be tailored by implantation of dopants, which increase the conductivity.

All of these resistor types, however, produce heat when current flows through them. The heat that is generated in the resistor increases the resistivity through the thermal coefficient of resistance ($\beta$). The generated heat can also permanently alter the value of the resistance by changing the grain size of the polysilicon, by burning out portions (or all) of the film and by redistributing the dopant atoms. These effects limit the amount of current that the resistor can tolerate. In addition to effects on the resistor itself, the generated heat may be conducted into the metal lines that are connected to the resistor and also into metal lines that may be located immediately above the resistor. Heating of the attached and nearby metal structures increases the susceptibility of the metal to electromigration, a process that produces holes in the metallization in response to current flow. Consequently, limiting the current through the resistor protects both the resistor stability and the integrity of the nearby metallization.

However, limiting the current through a resistor is at odds with the continued drive toward circuit miniaturization and the trend toward progressively greater current densities for high-performance circuits. That is, the heating constraint on resistor current is contending with circuit miniaturization and with circuit power requirements.

Accordingly, there exists a need in the art to overcome the deficiencies and limitations described hereinabove.

SUMMARY

In a first aspect of the invention, a method of forming a semiconductor structure comprises: forming a resistor over a substrate; forming at least one first contact in contact with the resistor; and forming at least one second contact in contact with the resistor. The resistor is structured and arranged such that current flows from the at least one first contact to the at least one second contact through a central portion of the resistor. The resistor comprises at least one extension extending laterally outward from the central portion in a direction parallel to the current flow. The method comprises sizing the at least one extension based on a thermal diffusion length of the resistor.

In another aspect of the invention a method comprises: forming a resistor over an insulator layer over a substrate; forming a first silicide contact at a first location on the resistor; and forming a second silicide contact at a second location on the resistor. The method also comprises: forming a first contact over and contacting the first silicide contact; forming a second contact over and contacting the second silicide contact; forming a first interconnect over and contacting the first contact; and forming a second interconnect over and contacting the second contact. The second location is different than the first location and the resistor is structured and arranged such that current flows from the first contact to the second contact through a central portion of the resistor. The resistor comprises extensions extending laterally outward from the central portion in a direction parallel to the current flow. The extensions are formed in a same plane as the central portion.

In yet another aspect of the invention, a semiconductor structure comprises: a resistor over an insulator layer over a substrate; a first contact contacting the resistor at a first location; a second contact contacting the resistor at a second location different from the first location; a first interconnect contacting the first contact; and a second interconnect contacting the second contact. The resistor is structured and arranged such that current flows from the first contact to the second contact through a central portion of the resistor. The resistor comprises extensions extending laterally outward from the central portion in a direction parallel to the current flow. A size of the extensions is based on a thermal diffusion length of the resistor.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a resistor, which comprises the structures of the present invention. In still further embodiments, a method in a computer-aided design system is provided for generating a functional design model of the resistor. The method comprises generating a functional representation of the structural elements of the resistor.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to thin film resistors for reduced heating and methods of manufacture. In accordance with aspects of the invention, a resistor includes additional resistor material (e.g., diffused silicon, polysilicon, refractory metal, etc.) that extends laterally beyond a contact region of the resistor to provide a larger area for thermal conduction for the resistor without changing the electrical resistance of the resistor. This advantageously provides a reduction in thermal resistance of the resistor, and consequently the ability to reduce the temperature of the resistor quicker. In embodiments, the resistors have an expanded thermal footprint, which provides lower thermal resistance. This is possible due to extending the Si, polysilicon or refractory metal beyond the contacts.

Resistive heating is a physical consequence of electric current passing through the material of a resistor. Implementations of the invention reduce the temperature of a resistor by reducing the thermal resistance of the resistor, which causes heat to conduct away from a resistor faster than is presently done in conventional resistors. The thermal resistance of a specific resistor is determined by the thermal conductivity of the materials in contact with the resistor and the substrate Si (which acts as the thermal reservoir), and by the thickness (e.g., vertical height) and lateral dimensions (e.g., length and width). As such, resistance is influenced by both a materials component and a geometric component.

Polysilicon resistors typically reside on an insulator layer (e.g., $SiO_2$ or similar material) above an Si substrate. Heat in the resistor spreads by thermal conduction into the surrounding oxide and from the oxide into the Si substrate. Heat generated during resistive heating may flow directly down through the oxide between the resistor and the substrate. The heat may also flow out of the top and the side edges of the resistor. As such, there are top, side, and bottom heat conduction paths from the resistor.

Figure 1:
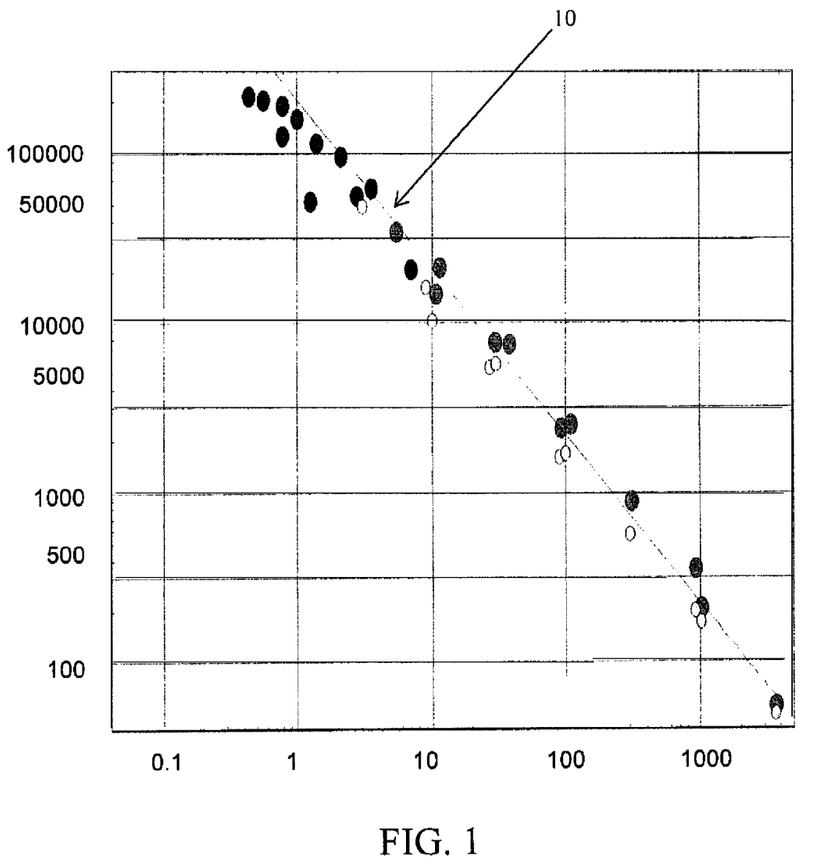
FIG. 1 shows a relationship between resistor area and thermal resistance.

Thermal resistance depends on the geometry of the resistor and the surrounding oxide. For large resistors, the side and top conduction paths contribute relatively little heat conduction, and nearly all of the heat flows out through the bottom path (e.g., through the bottom surface of the resistor into adjacent insulator). In such cases, the thermal resistance can be approximated by $R_{th}=(ti/ki)/A$, where A is the area of the resistor, ti is the thickness of the insulator between the resistor and the substrate, and ki is the thermal conductivity of the insulator. The thermal resistance is proportional to 1/A for these resistors. This relationship is demonstrated by curve 10 in FIG. 1 in which the x-axis represents resistor area and the y-axis represents thermal resistance. For resistors whose width and length are comparable to ti, the side and top paths become significant and the thermal resistance begins to decrease relative to the 1/A dependence.

Figure 2A:
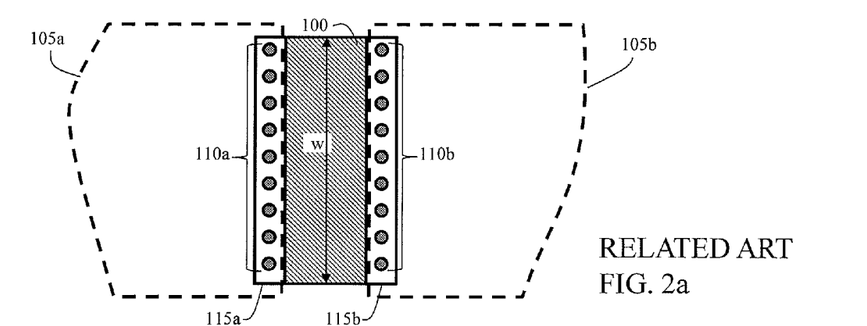
FIGS. 2a and 2b show plan and side views, respectively, of a resistor.
Figure 2B:
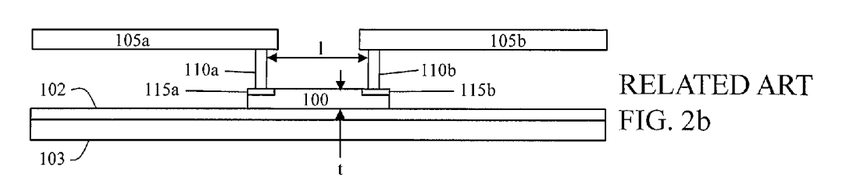

FIG. 2a shows a plan view (e.g., top down view) of a resistor 100, and FIG. 2b shows a corresponding side view of the resistor 100. The resistor 100 comprises resistive material (e.g., diffused silicon, polysilicon, refractory metal, etc.) formed in a layer of a semiconductor structure. For example, the resistor 100 may be composed of polysilicon formed over an oxide layer 102 overlying a silicon region 103 (e.g., substrate). Although not shown, there may optionally be an additional silicon film between the resistor 100 and the oxide layer 102.

Metallization elements 105a and 105b (e.g., wires or interconnects) are formed in a layer of the semiconductor structure above the resistor 100. At least one contact 110a extends vertically between the resistor 100 and the first metallization 105a, and at least one contact 110b extends vertically between the resistor 100 and the second metallization 105b. The respective contacts 110a and 110b place the resistor in electrical communication with the respective metallizations 105a and 105b. Silicide regions 115a and 115b are optionally formed at the top surface of the resistor 100 to provide enhanced electrical contact between the contacts 110a and 110b and the resistor 100. Electric current may flow from one metallization 105a to the other metallization 105b through the contacts 110a and 110b and the resistor 100. Thus, electric current flows in the resistor 100 substantially only between the contacts 110a and 110b.

The resistor 100 has a length "l" in a direction parallel to current flow between the contacts 110a and 110b. The length "l" corresponds to the distance between the contacts 110a and 110b. The resistor 100 has a width "w" in a direction perpendicular to the current flow (e.g., perpendicular to and in the same plane as the length direction). The resistor 100 has a thickness "t" in a vertical direction orthogonal to the length and width directions. The electrical resistance of the resistor 100 equals (rho*length)/(width*thickness), where rho is the electrical resistivity of the material of the resistor 100. As such, the electrical resistance of the resistor 100 is substantially defined by the material composition and shape of the resistor 100 between the contacts 110a and 110b.

Figure 2C:
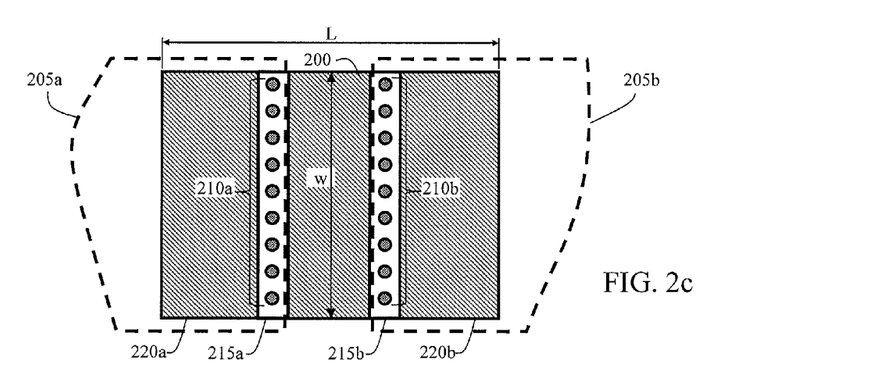
FIGS. 2c and 2d show plan and side views, respectively, of a resistor in accordance with aspects of the invention.
Figure 2D:
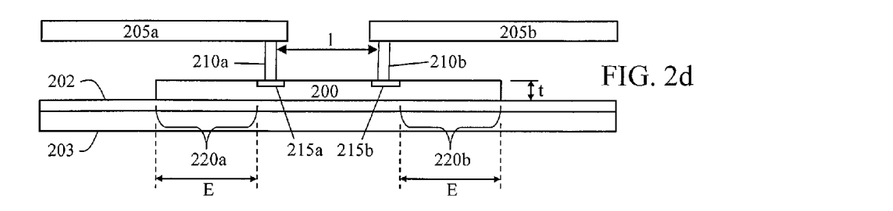

FIGS. 2c and 2d show respective top and side views of a resistor 200 in accordance with aspects of the invention. In embodiments, the structure includes metallization elements 205a and 205b, contacts 210a and 210b, and optional silicide regions 215a and 215b (which may be similar to the metallization elements 105a and 105b, contacts 110a and 110b, and optional silicide regions 115a and 115b). The resistor 200 may comprise polysilicon formed over an oxide layer 202 overlying a silicon region 203 (e.g., substrate). Although not shown, there may optionally be an additional silicon film between the resistor 200 and the oxide layer 202.

In embodiments, electric current flows in the resistor 200 substantially only between the contacts 210a and 210b. The resistor 200 may have the same conducting length "l", width "w", and thickness "t" as that of resistor 100, which causes resistor 200 to have substantially the same electrical resistance as resistor 100. In embodiments, the width "w" is greater than or equal to ten times the length "l". For example, the width "w" may be about 10 µm and the length "l" may be about 1 µm. The invention is not limited to these dimensions, however, and any suitable length and width may be used within the scope of the invention.

According to aspects of the invention, the resistor 200 includes extensions 220a and 220b. In embodiments, the extensions 220a and 220b extend in the lateral direction (e.g., parallel to the current flow between the contacts 210a and 210b) by an amount "E". In further embodiments, the extensions 220a and 220b are in a same plane as a central portion of the resistor (e.g., the portion of the resistor through which current flows between the contacts 210a and 210b).

In accordance with aspects of the invention, the extensions 220a and 220b provide additional area for the resistor to dissipate heat (e.g., additional thermal footprint). In particular, the extensions 220a and 220b reduce the thermal resistance of the resistor 200. In embodiments, the thermal conductivity of the resistor 200 is greater than that of the oxide layer 202, which causes heat to spread laterally into the extensions 220a and 220b and from there down into the oxide layer 202 and silicon 203. As such, the extensions 220a and 220b provide an increased thermal area for the resistor 200 compared to resistor 100. This increased thermal area reduces the thermal resistance of the resistor 200.

In accordance with aspects of the invention, the resistor 200 has the same electrical resistance as the resistor 100, and the resistor 200 has a lower thermal resistance than the resistor 100. This is because the electrical resistance is a function of the electrical resistivity of the resistor material, conduction length "l" and cross sectional area of the resistor material between the contacts, all of which are substantially the same for both resistors 100 and 200. The thermal resistance, on the other hand is approximated by $R_{th}=(ti/ki)/A$, where A is the area of the resistor, ti is the thickness of the insulator between the resistor and the substrate, and ki is the thermal conductivity of the insulator. The values of ti and ki are the same for resistors 100 and 200 since the oxide layers 102 and 202 are substantially the same. However, the area (A) of the resistor 200 is w*L, which is greater than the area (A) of the resistor 100 which is w*l. Thus, resistor 200 has a greater thermal area than resistor 100, which provides resistor 200 with a lower thermal resistance than resistor 100. The lower thermal resistance of resistor 200 permits resistor 200 to dissipate more heat than resistor 100, which allows the resistor 200 to handle higher current than resistor 100 while still providing the same electrical resistance.

In embodiments, the resistor 200 (including the extensions 220a and 220b) is composed of doped polysilicon and the extensions 220a and 220b have a length of about 1.5 times the conducting length "l". This provides a sufficiently large thermal area (e.g., thermal footprint) of the resistor 200 without making the resistor 200 too large. The invention is not limited to polysilicon resistors. Instead, the extensions may be utilized with any thin-film precision resistor (e.g., polysilicon, diffused silicon, refractory metal such as TaN or TiN, etc.) in which the resistor material has a higher thermal conductivity than the underlying insulating layer.

Figure 2E:
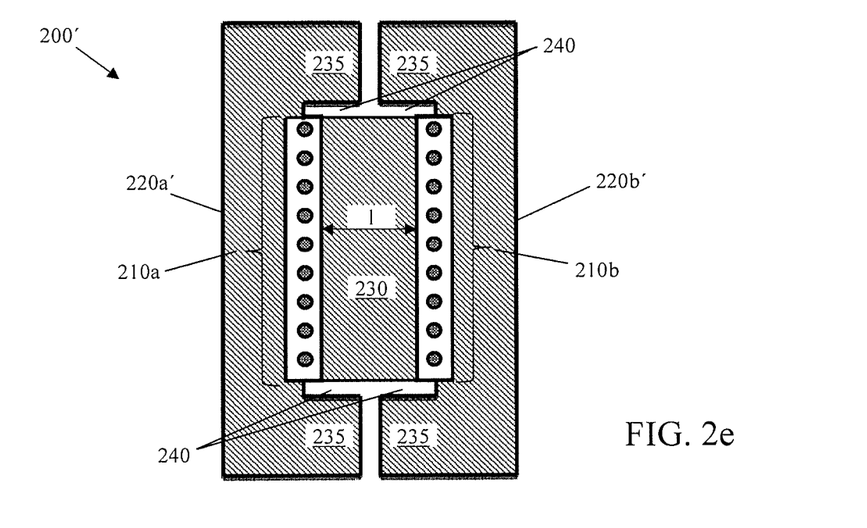
FIG. 2e shows a top view of a resistor in accordance with aspects of the invention.

Moreover, the invention is not limited to extension regions that are 1.5 times the conducting length "l". Instead, the extensions may have any desired size and shape. For example, FIG. 2e shows an embodiment of a resistor 200' in which extensions 220a' and 220b' extend laterally parallel to the current direction (e.g., parallel to length "l") and also wrap around the ends of central portion 230 of the resistor (e.g., the portion of the resistor through which current flows between the contacts 210a and 210b). Generated heat may flow into the wrap around regions 235, which increases the thermal footprint of the resistor 200'. A gap 240 between the wrap around regions 235 and the central portion 230 prevents the wrap around regions 235 from affecting the electrical resistance. The gap 240 ensures that current flows substantially only in the central portion 230, and that substantially no current flows through the wrap around regions 235. In embodiments, the wrap around regions 235 are formed in a same plane as a central portion 230. The wrap around regions 235 permit the resistor 200' to be made narrower than the resistor 200, which can be used for space optimization in a chip. Other sizes and shapes of extensions may be used within the scope of the invention.

In embodiments, the length of the extensions (e.g., extensions 220a and 220b) is based on a thermal diffusion length of the resistor material and a thermal diffusion length of the underlying insulator layer. The thermal diffusion length is $L=2*\sqrt{D*time}$, where D is the thermal diffusivity of the material. The thermal diffusivity is $D=K/\rho C$, where K is the thermal conductivity of the material, $\rho$ is the mass density of the material, and C is the heat capacity of the material. For silicon, K equals about 148 W/(m–C), $\rho$ equals 2.33 g/cm$^3$, and C equals 705 J/(kg-K). For oxide, K equals about 0.5 W/(m–C), $\rho$ equals 2.657 g/cm$^3$, and C equals 699 J/(kg–K). Using these values, the thermal diffusivity of oxide is about 2.8e-3 cm$^2$/sec and the thermal diffusivity of silicon is about 0.9 cm$^2$/sec. For an exemplary heating time of 5-9 seconds, the thermal diffusion length of the oxide is about 0.08 µm and the thermal diffusion length of silicon is about 1.34 µm. Thus, in this example, the same amount of heat will travel through about 0.225 µm of oxide as will travel through about 3.8 µm of silicon.

In the example above in FIGS. 2c and 2d, the resistor 200 is composed of polysilicon, the oxide layer 202 is composed of oxide, and the oxide layer has a vertical thickness of 0.225 µm. Accordingly, the extensions 220a and 220b have a length "E" of about 3.8 µm. In this manner, the size of the extensions 220a and 220b is tailored to the thermal diffusion length of the resistor material, the thermal diffusion length of the oxide layer 202, and the thickness of the oxide layer 202. Making the length "E" shorter than about 3.8 µm would fail to take full advantage of the thermal diffusion length, whereas making the length "E" longer than about 3.8 µm would unnecessarily add material (and size) to the resistor since the excess length would provide diminishing returns of heat transfer. This tailoring of the size of the extensions permits efficient heat dissipation and also avoids making the extensions too large.

Figure 2F:
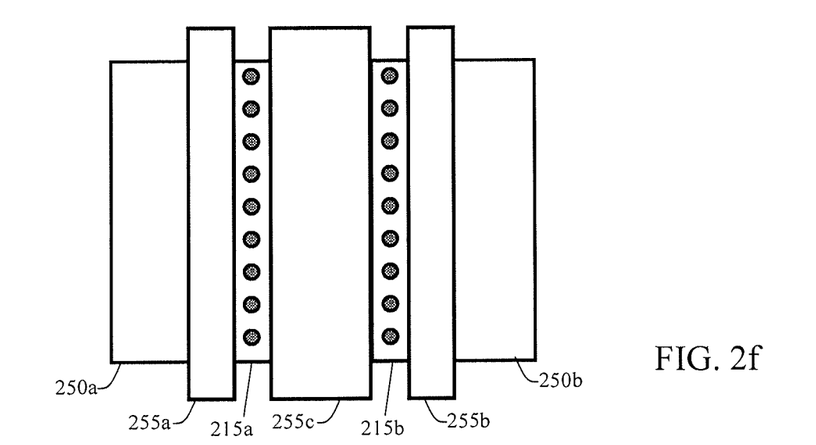
FIGS. 2f and 2g show plan and side views, respectively, of a resistor in accordance with aspects of the invention.
Figure 2G:
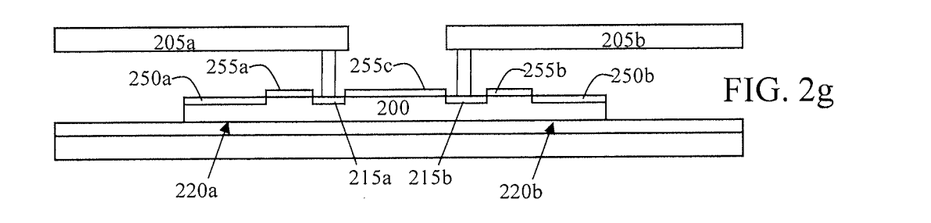

FIGS. 2f and 2g show respective top and side views of the resistor 200 in accordance with further aspects of the invention. More specifically, FIGS. 2f and 2g show an embodiment similar to that shown in FIGS. 2c and 2d but with additional silicide layers 250a and 250b formed on the upper surface of the extensions 220a and 220b (the overlying metal layers 205a and 205b are not shown in FIG. 2f). The silicide layers 250a and 250b may be formed in the same processing step (and of the same material) as the silicide contacts 215a and 215b. In embodiments, the silicide layers 250a and 250b are physically disconnected from the silicide contacts 215a and 215b by forming nitride masks 255a and 255b on the resistor 200 prior to forming the silicide layers 250a and 250b and silicide contacts 215a and 215b. An additional nitride mask 255c may optionally be formed on the central portion of the resistor between the contacts 215 and 215b.

In accordance with aspects of the invention, the silicide layers 250a and 250b serve as an enhanced thermal conductor due to their electron contribution to the thermal conduction. Additionally, by being electrically isolated from the silicide contacts 215a and 215b by a layer of intrinsic polysilicon under the nitride masks 255a and 255b, the silicide layers 250a and 250b avoid extra capacitance that would otherwise be generated by the extensions if the silicide contacts 215a and 215b were connected to the silicide layers 250a and 250b.

In embodiments, when capacitance of the resistor 200 is a design concern, the silicide layers 250a and 250b may be omitted, as in FIGS. 2c and 2d. The omission of the silicide layers 250a and 250b makes the resistor more resistive, such that when current is running through the resistor for short durations, little charge flows into the extensions 220a and 220b and the total capacitance of the resistor is lower than when silicide layers 250a and 250b are present.

The exemplary embodiments described with respect to FIGS. 2c-2f comprise a polysilicon resistor. The invention is not limited to polysilicon resistors, however, and any suitable thin film resistors may be used in implementations of the invention. For example, extensions (e.g., extensions 220a and 220b) for improved heat dissipation may be used with a diffused resistor (e.g., single crystal silicon formed on a buried oxide layer of an SOI wafer), and also with refractory metal resistors (e.g., TaN, TiN, etc.) that are formed in dielectric layers (e.g., wiring levels) of a wafer. Moreover, polysilicon resistors and refractory metal resistors may be formed with extensions in accordance with aspects of the invention in non-SOI wafers, e.g., using a bulk semiconductor substrate, as described in greater detail herein.

Figure 3:
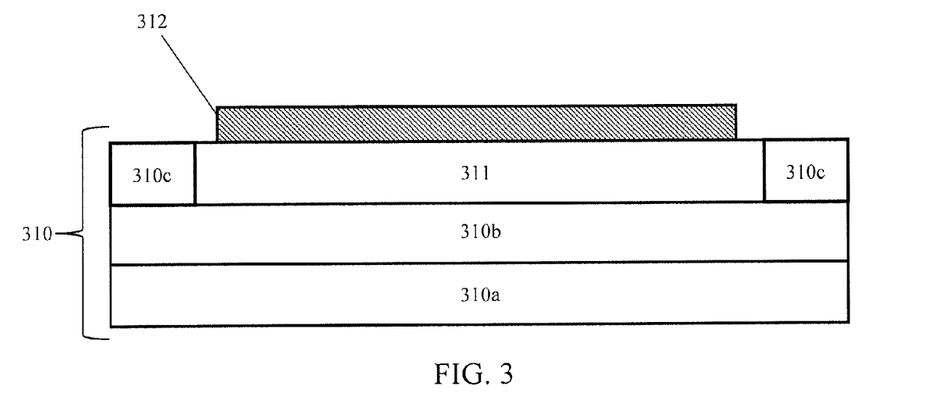
FIGS. 3-19 show processing steps and structures in accordance with aspects of the invention.

FIGS. 3-8 show processing steps and structures in accordance with aspects of the invention. Specifically, FIG. 3 shows an exemplary SOI wafer 310 employed as an intermediate structure in implementations of the invention. The SOI wafer 310 has a bulk semiconductor substrate 310a, which is typically a silicon substrate, a buried insulator layer 310b formed on the substrate 310a, and a semiconductor layer 310c, which is typically a silicon layer, formed on the buried insulator layer 310b. The substrate 310a and buried insulator layer 310b may be similar to the substrate 203 and insulator layer 202, respectively, described above with respect to FIGS. 2c and 2d. The SOI wafer 310 may be fabricated using techniques well know to those skilled in the art. For example, the SOI wafer 310 may be formed by conventional processes including, but not limited to, oxygen implantation (e.g., SIMOX), wafer bonding, etc.

The constituent materials of the SOI wafer 310 may be selected based on the desired end use application of the semiconductor device. For example, the substrate 310a may be composed of any suitable material including, but not limited to, Si, SiGe, SiGeC, SiC, GE alloys, GaAs, InAs, InP, and other III/V or II/VI compound semiconductors. The buried insulator layer 310b may be composed of oxide, such as $SiO_2$, and may be referred to as a buried oxide (BOX) layer 310b. Moreover, although the SOI wafer is referred to as "silicon on insulator," the semiconductor layer 310c is not limited to silicon. Instead, the semiconductor layer 310c may be comprised of various semiconductor materials, such as, for example, Si, SiGe, SiC, SiGeC, etc.

In embodiments, the SOI wafer 310 has a thickness of about 700 μm, with the BOX layer 310b having a thickness of about 0.15 μm, and the semiconductor layer 310c having a thickness of about 0.08 μm. However, the invention is not limited to these dimensions, and the various portions of the SOI wafer may have any desired thicknesses based upon the intended use of the final semiconductor device.

One or more shallow trench isolation (STI) structures 311 are formed in the wafer 310 using conventional semiconductor fabrication techniques and STI materials, which locally replace a portion of the silicon layer 310c. In accordance with aspects of the invention, a resistor 312 is formed over an STI structure 311. In embodiments, the resistor 312 comprises electrically conductive doped polysilicon and is formed using conventional semiconductor processing techniques, such as chemical vapor deposition (CVD), photolithographic patterning, ion implantation, etc.

Figure 4:
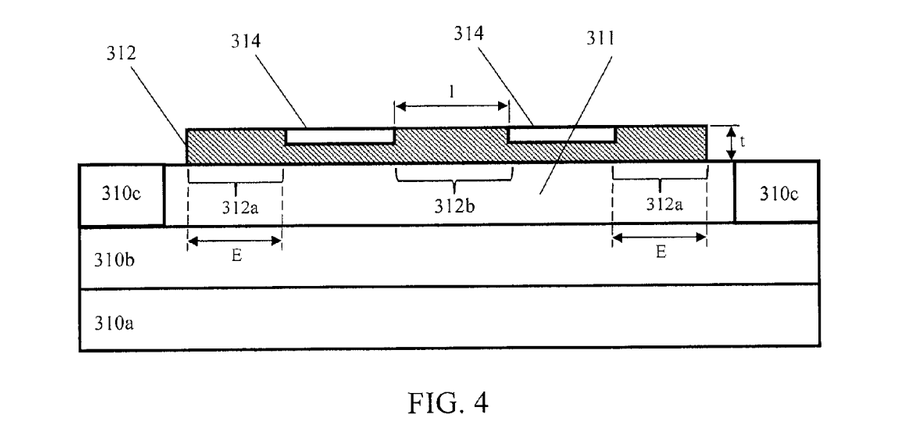

FIG. 4 shows the formation of silicide contacts 314 on the resistor 312 in accordance with aspects of the invention. The silicide contacts 314 may be similar to silicide contacts 215a and 215b, and may be formed using conventional semiconductor processing steps. For example, the silicide contacts 314 may be formed by depositing a metal film, such as cobalt, titanium, tungsten, or nickel, on the polysilicon of the resistor 312 and annealing the structure to create silicide.

As depicted in FIG. 4, the resistor 312 includes extensions 312a that extend laterally outward from the silicide contacts 314. In embodiments, the extensions 312a are similar to extensions 220a and 220b in that they provide an increased thermal footprint that is outside of the resistor portion 312b between the contacts 314. In embodiments, the resistor 312 is similar to resistor 200 in that it has a width "w" that is much greater than its length "l" (e.g., w>>l), such that a heat path is short from the resistor portion 312b to the expanded footprint formed by the extensions 312a. In embodiments, the resistor 312 has a width "w" of about 10 μm, a length "l" between the contacts 314 of about 1 μm, and a thickness "t" of about 0.1 μm, depending on the design of the overall structure. The resistor 312 is not limited to these dimensions, however, and any suitable dimensions may be used within the scope of the invention.

Moreover, in accordance with aspects of the invention, the size and shape of the extensions 312a may be tailored based on a thermal diffusion length of the resistor 312, a thermal diffusion length of the BOX layer 310b, and a thickness of the BOX layer 310b, in a manner similar to that already described herein. In embodiments, the extensions 312a have a length "E" that is about 1.5 times the length "l" to ensure that adequate thermal area is provided by the extensions 312a for additional heat dissipation. In further embodiments, the length "E" is tailored based on a thermal diffusion length of the resistor 312, a thermal diffusion length of the BOX layer 310b, and a thickness of the BOX layer 310b. For example, the BOX layer 310b may be composed of oxide and have a thickness of about 0.225 μm, and the resistor 312 (including the extensions 312a) may be composed of polysilicon and the extensions 312a have a length "E" of about 3.8 μm.

Figure 5:
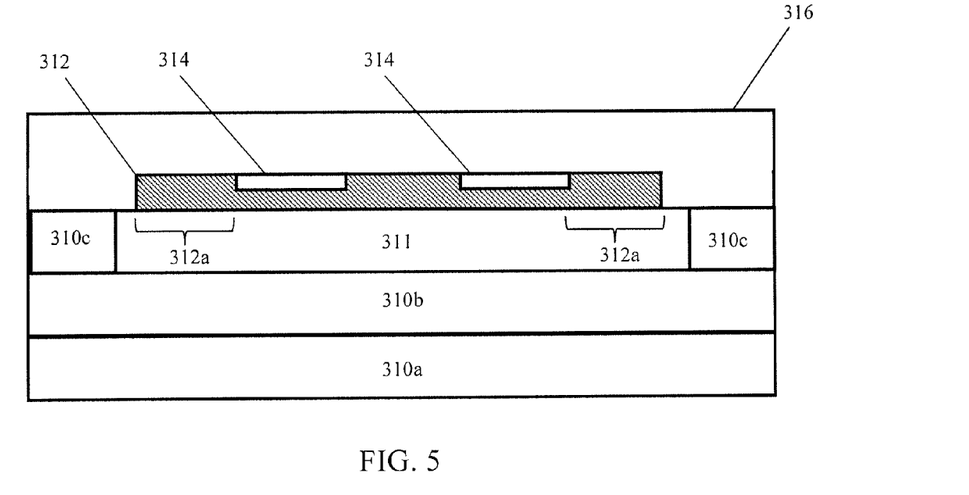

FIG. 5 shows the formation of an insulator layer 316 over the semiconductor layer 310c, the resistor 312 and the silicide contacts 314. The insulator layer 316 may be silicon dioxide ($SiO_2$) or any other suitable insulator material. The insulator layer 316 may be formed in any conventional manner, such as CVD.

Figure 6:
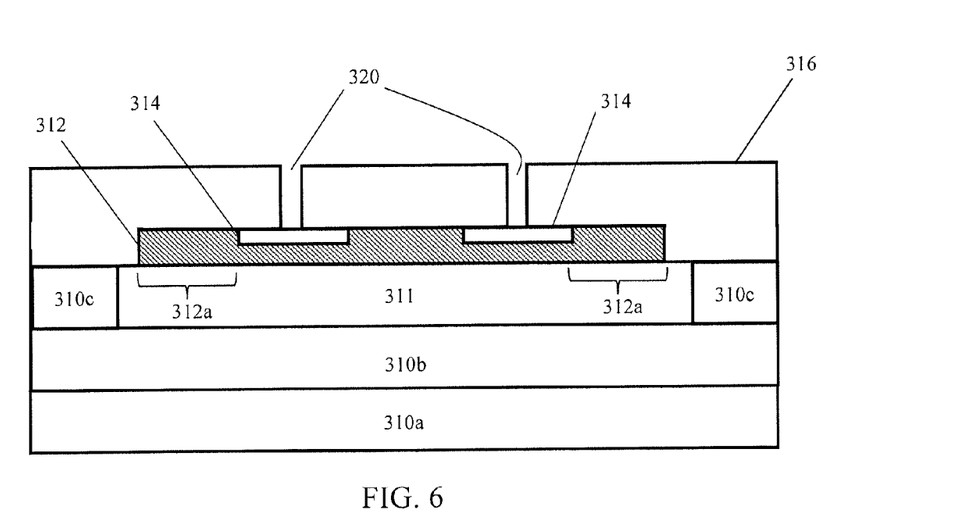

FIG. 6 depicts the formation of trenches 320 in the insulator layer 316. The trenches 320 may be formed in any desired manner. For example, the trenches 320 may be formed by masking the structure and performing a directional etch having a chemistry that selectively removes exposed portions of the insulator layer 316, e.g., portions of the insulator layer 316 that are not protected by the mask.

Figure 7:
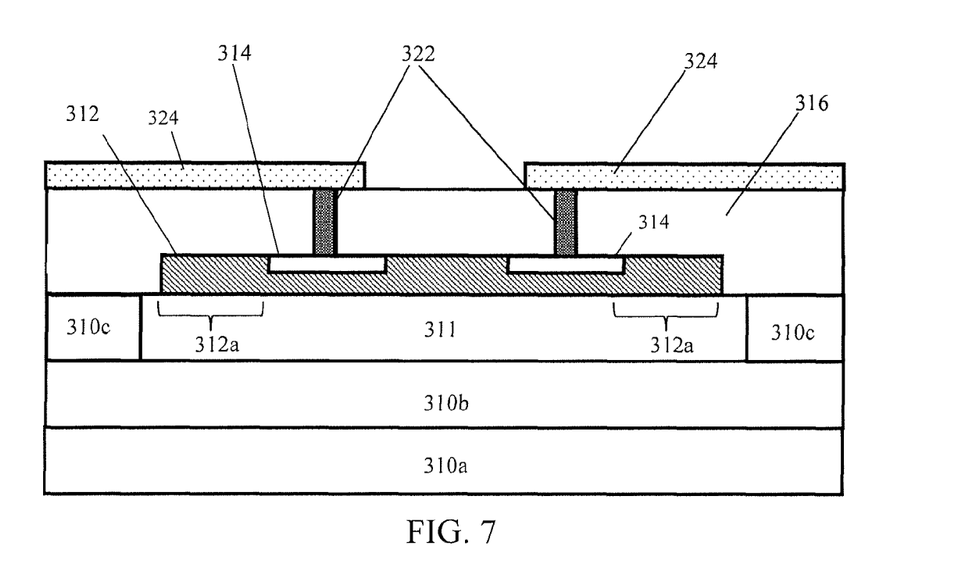

FIG. 7 shows the formation of contacts 322 in the trenches 320 and the formation of a metal layer 324 over the contacts 322 and the insulator layer 316. In embodiments, the contacts 322 are formed in any conventional manner, such as, for example, CVD. The contacts 322 may be tungsten or any other desired electrically conductive material. In embodiments, the contacts 322 may be in the form of a plurality of vias (e.g., an array of small pillars with a minimum diameter dependent on the technology, for example 0.25 μm in diameter) or in the form of a solid bar. In embodiments, the metal layer 324 is formed in any conventional manner, such as, for example, CVD and patterning. The metal layer 324 may be a layer of copper (Cu) or any other desired electrically conductive material. As shown in FIG. 7, the extensions 312a extend in a lateral direction outward from the contacts 322 in order to provide an expanded thermal footprint for enhanced heat dissipation for the resistor 312.

Figure 8:
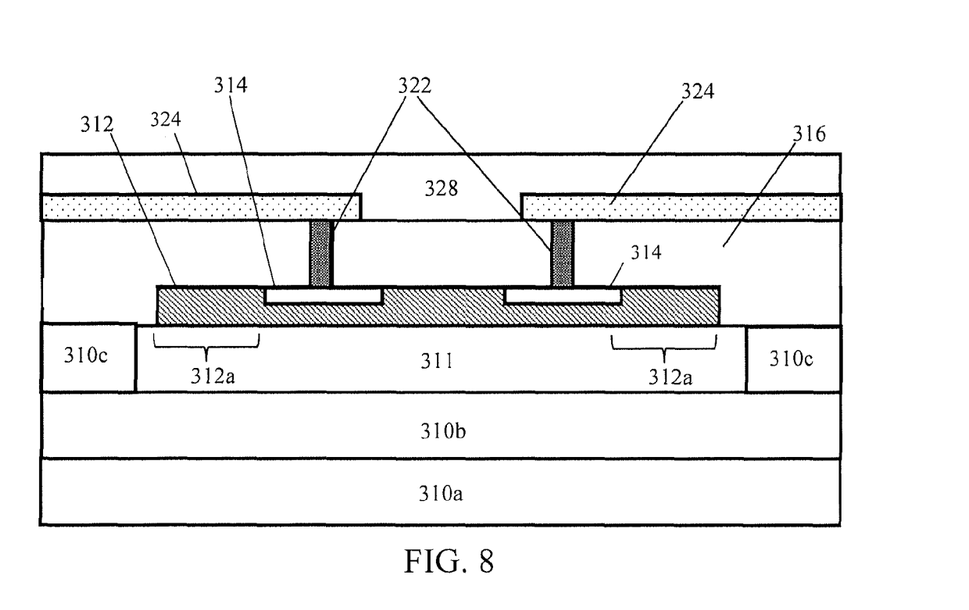

FIG. 8 shows the formation of an interlevel dielectric (ILD) 328. In embodiments, the ILD 328 may be formed using conventional semiconductor fabrication techniques, and may be composed of any suitable dielectric material, such as silicon dioxide ($SiO_2$), tetraethylorthosilicate (TEOS), borophosphosilicate glass (BPSG), hydrogen silsesquioxane (HSQ), etc.

Figure 9:
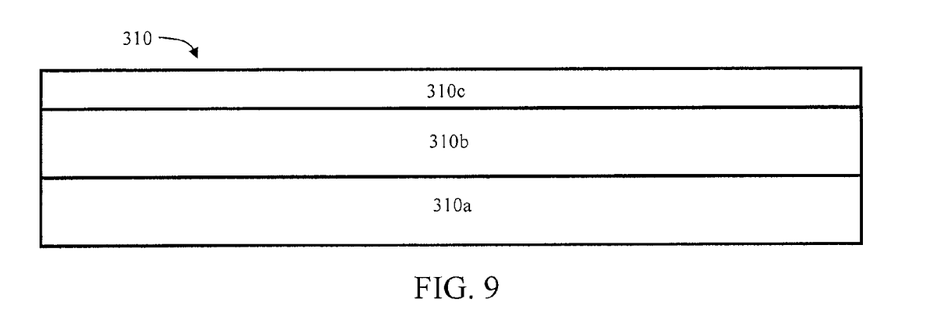
Figure 10:
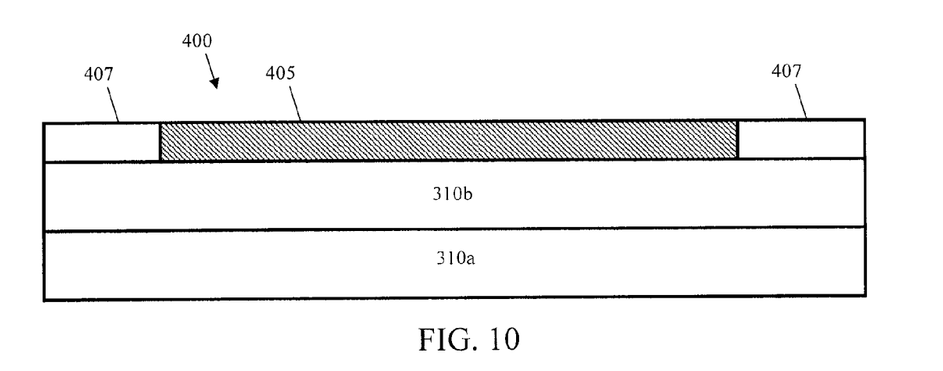
Figure 11:
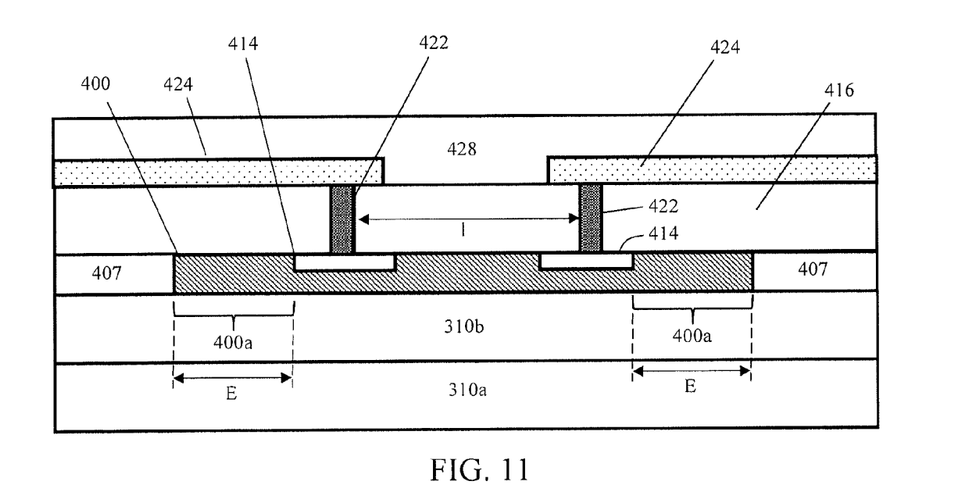

FIGS. 9-11 show processing steps and structures in accordance with aspects of the invention. Specifically, FIG. 9 shows an exemplary SOI wafer 310 comprising a semiconductor substrate 310a, a buried insulator layer 310b on the substrate 310a, and a semiconductor layer 310c on the buried insulator layer 310b. The SOI wafer 310 in FIG. 9 is similar to that described above with respect to FIG. 3.

FIG. 10 shows the formation of a diffused resistor (also called a diffusion resistor) 400 in the semiconductor layer 310c. The diffused resistor 400 may be formed using conventional diffusion resistor techniques, such as masking a resistor portion 405 of the semiconductor layer 310c, etching trenches in the semiconductor layer 310c on either side of the resistor portion 405, filling the trenches with insulator material e.g., such as STI material, removing the mask and excess trench fill, and performing an ion implantation in the resistor portion 405. These steps result in the formation of diffusion resistor 400 bounded by isolation regions 407.

In embodiments, the diffused resistor 400 begins as single crystal silicon (e.g., of semiconductor layer 310c) that is separated from the substrate 310a only by the buried oxide layer 310b. Diffusion doping may be used as an alternative to ion implantation. Dopant types used in the resistive region can include N-type and P-type dopants, for example. Contact regions in the diffused resistor may have the same dopant type as the resistive region, and may have a higher dopant concentration than the resistive region. A portion of the resistive region may be undoped or may be doped to a lesser concentration than the contact regions to obtain high resistance values. In the undoped state, low fixed charge densities enable high resistances.

FIG. 11 shows the resistor 400 after a number of semiconductor processing steps have been performed. In embodiments, silicide contacts 414 are formed at the upper surface of the diffused resistor 400. The silicide contacts 414 may be formed in a similar manner as silicide contacts 314. An insulator layer 416 is formed on the diffused resistor 400 and isolation regions 407. The insulator layer may be formed using conventional techniques and materials, such as CVD of $SiO_2$. Contacts 422, metal layers 424, and ILD 428 may be formed in a manner similar to contacts 322, metal layers 324, and ILD 328.

In accordance with aspects of the invention, the diffusion resistor 400 includes extensions 400a that extend laterally outward from the contacts 422 in order to provide an expanded thermal footprint for enhanced heat dissipation for the resistor 400. In embodiments, the extensions 400a have a length "E" that is at least 1.5 times the length "l" between the contacts 422 in order to provide adequate thermal area for increasing the heat dissipation of the resistor 400. In further embodiments, the length "E" is tailored based on a thermal diffusion length of the resistor 400, a thermal diffusion length of the BOX layer 310b, and a thickness of the BOX layer 310b. For example, the BOX layer 310b may be composed of oxide and have a thickness of about 0.225 µm, and the extensions 400a may have a length "E" of about 3.8 µm.

Figure 12:
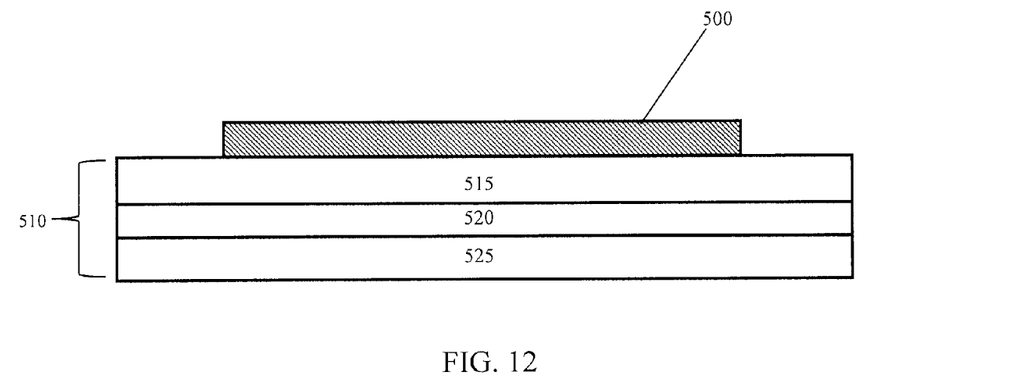
Figure 13:
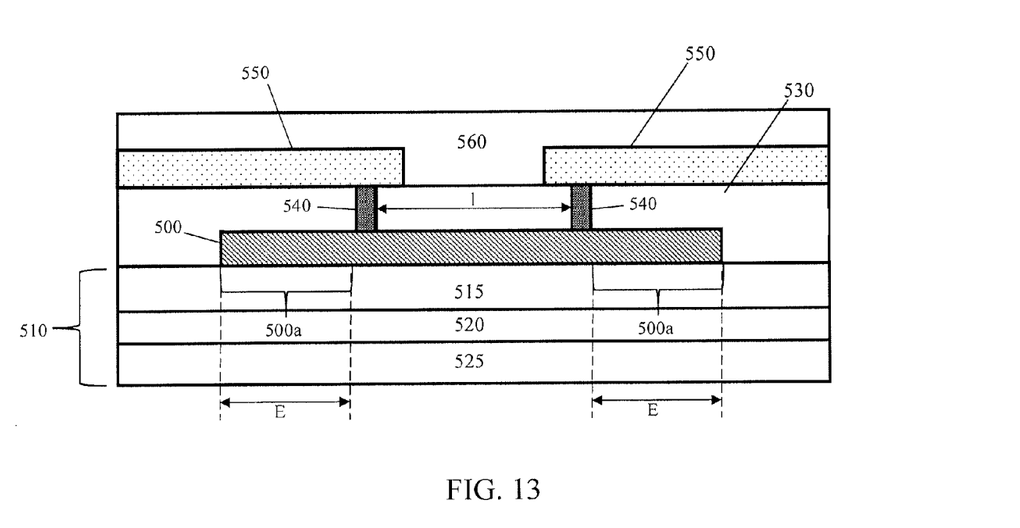

FIGS. 12 and 13 show processing steps and structures in accordance with aspects of the invention. Specifically, FIG. 12 shows a refractory metal resistor 500 formed over layers 510, comprising wiring layer 520 sandwiched between ILD layers 515 and 525, over a substrate (not shown). The resistor 500 may be formed at any desired location within the layers 510, and is shown by way of example only as being formed on the ILD layer 515 that lies over the wiring layer 520 and another ILD layer 525. ILD layers 515 and 525 may be composed of any suitable dielectric material, including but not limited to $SiO_2$, TEOS, BPSG, HSQ, etc. Wiring layer 520 may be composed of any desired metal and/or alloy, such as copper or aluminum.

In embodiments, the resistor 500 is composed of refractory metal such as tantalum nitride (TaN) or titanium nitride (TiN), and is formed using CVD. The invention is not limited to these materials and processes, and any suitable material and fabrication process may be used within the scope of the invention.

As depicted in FIG. 13, an ILD layer 530 is formed over the resistor 500, contacts 540 are formed in the ILD layer 530, metal interconnects 550 are formed on the ILD layer 530 and in direct contact with the contacts 540, and another ILD layer 560 is formed over the metal interconnects 550. The contacts 540, metal interconnects 550, and ILD layers 530 and 560 may be formed using processes and materials already described herein.

In accordance with aspects of the invention, the resistor 500 includes extensions 500a that extend laterally outward from the contacts 540 in order to provide an expanded thermal footprint for enhanced heat dissipation for the resistor 500. In embodiments, the extensions 500a have a length "E" that is at least 1.5 times the length "l" between the contacts 540 in order to provide adequate thermal area for increasing the heat dissipation of the resistor 500. In further embodiments, the length "E" is tailored based on a thermal diffusion lengths of the respective components, as described herein. The resistor 500 may be used with SOI and non-SOI (e.g., bulk silicon) wafers since the resistor 500 is formed in the wiring levels above the substrate.

Figure 14:
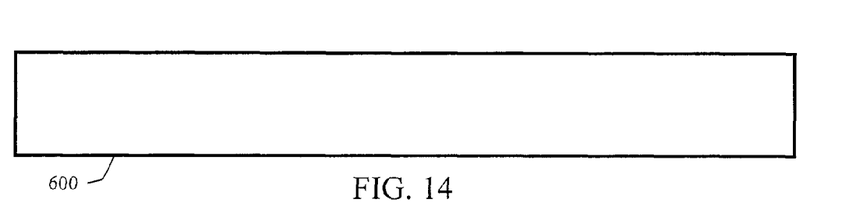

The polysilicon resistor 312 described with respect to FIGS. 3-8 is used with an SOI wafer. In accordance with aspects of the invention, the polysilicon resistor 312 may also be implemented in bulk semiconductor (e.g., non-SOI) technology that is devoid of a buried insulator (e.g., buried oxide) layer. More specifically, FIG. 14 shows a bulk semiconductor substrate 600 composed of, for example, silicon.

Figure 15:
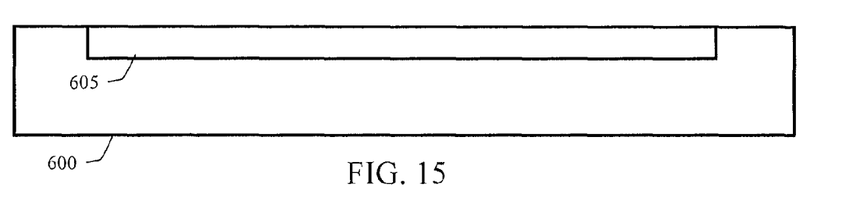

FIG. 15 shows the formation of an isolation region 605 within the substrate 600. The isolation region 605 may be composed of any suitable insulator, such as $SiO_2$. The isolation region 605 may be formed in a manner similar to the STI structures 311 described with respect to FIG. 3. For example, the isolation region 605 may be formed by masking the substrate 600, forming a trench in the substrate by etching, and filling the trench with $SiO_2$ or other insulator material. In embodiments, the isolation region 605 has a thickness of about 0.25 µm, but can have any desired thickness within the scope of the invention.

Figure 16:
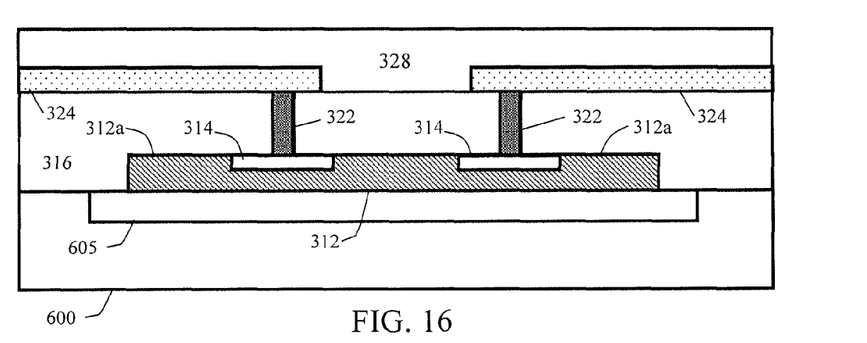

As depicted in FIG. 16, after formation of the isolation region 605, processing may proceed as described above with respect to FIGS. 3-8. That is, a polysilicon resistor 312 may be formed on the isolation region 605. Also, silicide contacts 314, insulator layer 316, contacts 322, metal layer 324, and ILD 328 may be formed in the manner described above with respect to FIGS. 3-8. As shown in FIG. 16, the resistor 312 may have extensions 312a that extend in a lateral direction outward from the contacts 322 to provide an expanded thermal footprint for enhanced heat dissipation for the resistor 312.

As described above, the isolation region 605 may be formed using STI processes and materials. Alternatively, the isolation region 605 may be formed using thick gate dielectric having a thickness of about 50 Å to about 100 Å, or using thin gate dielectric having a thickness less than 50 Å.

Figure 17:
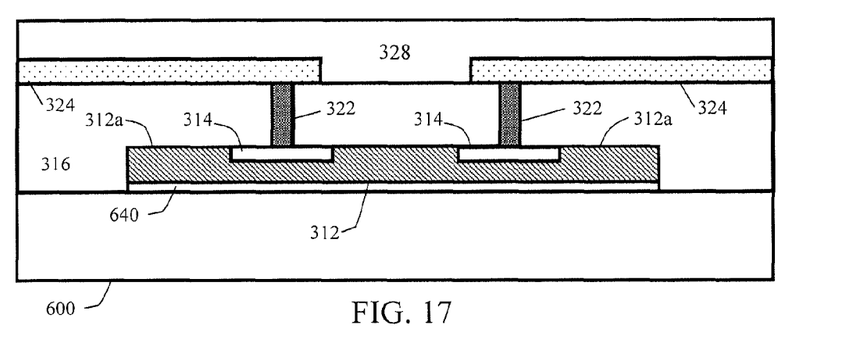

Alternatively, in the case of gate dielectric type isolation regions, a layer of the gate dielectric material may be formed directly in the top surface of the substrate 600 without forming a trench in the substrate. A layer of polysilicon is formed on the layer of gate dielectric material, and the polysilicon and gate dielectric material are patterned using standard techniques (e.g., photolithographic masking and etching) to form the polysilicon resistor 312 and the gate dielectric 640 on the substrate 600, as shown in FIG. 17. As additionally shown in FIG. 17, the processes described herein may be used to form silicide contacts 314, insulator layer 316, contacts 322, metal layer 324, and ILD 328.

Figure 18:
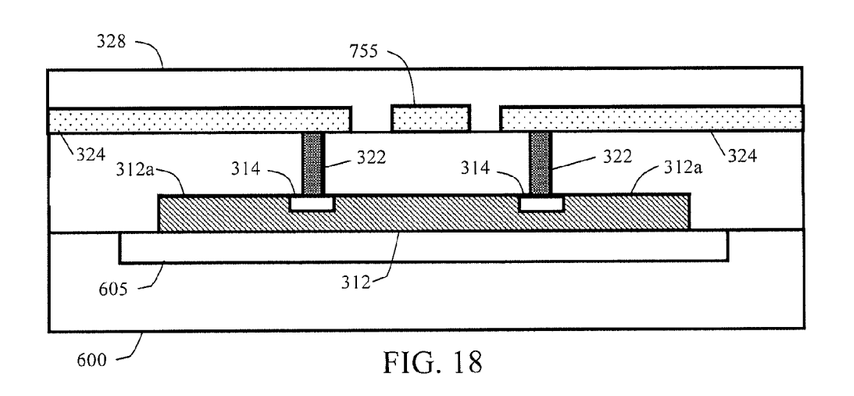
Figure 19:
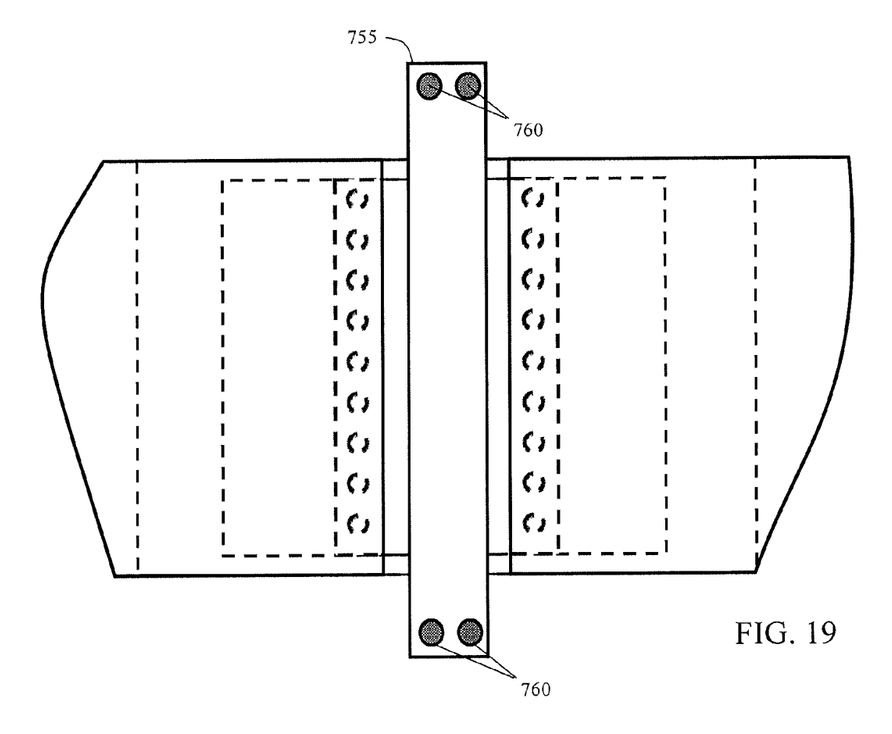

FIGS. 18 and 19 show respective top and side views of another resistor in accordance with aspects of the invention. The structure shown in FIGS. 18 and 19 may be formed in the same manner as that described above with respect to FIGS. 14-16 with the addition of a heat sink 755 and heat sink contacts 760. According to aspects of the invention, the heat sink 755 extracts heat away from the center of the resistor 312 to assist in cooling the resistor 312. In embodiments, the heat sink 755 is formed in the same step as the metal layer 324 using appropriate masking and deposition techniques atop the insulator layer 316.

In accordance with aspects of the invention, heat sink contacts 760 extend from direct contact with the heat sink 755 to direct contact with the substrate 600, and provide an additional heat conduction path to the substrate 600. The heat sink contacts 760 may be formed in any suitable manner, such as forming aligned vias or contacts in respective layers above the substrate as each layer is formed. Such contacts, for example, may be formed in the same manner as diffusion contacts while omitting the diffusion step.

The heat sink 755 is particularly useful when the width "w" of the resistor 312 (e.g., perpendicular to the current flow) is not greater than the conductive length "l" (e.g., parallel to the current flow). For example, when the resistor 312 has a width "w" of about 1 µm and a length "l" of about 10 µm, the use of extensions 312a to create a thermal footprint larger than the resistor 312 is less effective because the length of the diffusion path beyond the contacts 322 is much longer than in the case of a resistor that has a width "w" of about 10 µm and a length "l" of about 1 µm. Accordingly, heat may be extracted from the center of the resistor by the heat sink 755 and conducted to the substrate using contacts 760.

Figure 20:
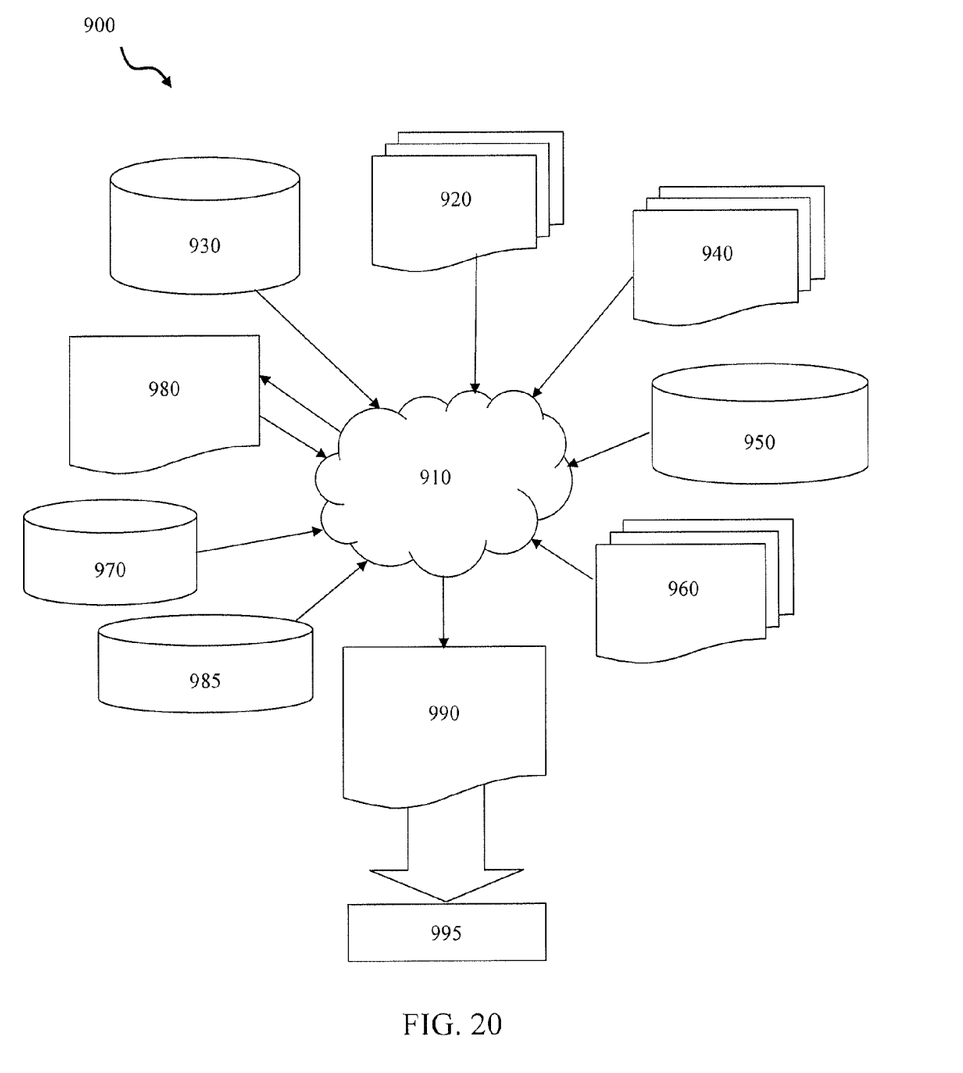
FIG. 20 is a flow diagram of a design process used in semiconductor design, manufacture, and/or test.

FIG. 20 is a flow diagram of a design process used in semiconductor design, manufacture, and/or test. FIG. 20 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2a-19. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 20 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2a-19. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2a-19 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2a-19. In one embodiment, design structure 990 may comprise a compiled, executable HDL simulation model that functionally simulates the devices shown in FIGS. 2a-19.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2a-19. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a semiconductor structure, comprising:
    forming a resistor over a substrate;
    forming at least one first contact in contact with the resistor; and
    forming at least one second contact in contact with the resistor,
    wherein the resistor is structured and arranged such that current flows from the at least one first contact to the at least one second contact through a central portion of the resistor;
    the resistor comprises at least one extension extending laterally outward from the central portion in a direction parallel to the current flow; and
    the forming the resistor comprises sizing the at least one extension based on a thermal diffusion length of the resistor wherein the resistor comprises a resistor material and the thermal diffusion length of the resistor is calculated based on a thermal diffusivity of the resistor material.

2. The method of claim 1, wherein the forming the resistor comprises forming the resistor over an insulator layer over the substrate.

3. The method of claim 2, wherein the sizing the extension comprises sizing the at least one extension based on the thermal diffusion length of the resistor, a thermal diffusion length of the insulator layer, and a thickness of the insulator layer.

4. The method of claim 1, wherein:
    the substrate is comprised in a silicon on-insulator (SOI) wafer;

the SOI wafer comprises a buried insulator layer on the substrate and a silicon film on the buried insulator layer; and the forming the resistor comprises forming a polysilicon resistor on an insulator layer that replaces a portion of the silicon film.

5. The method of claim 1, wherein:

the substrate is comprised in a silicon-on-insulator (SOI) wafer;

the SOI wafer comprises a buried insulator layer on the substrate and a silicon film on the buried insulator layer; and the forming the resistor comprises forming a diffused resistor in the silicon film.

6. The method of claim 1, wherein the forming the resistor comprises forming a refractory metal resistor in a wiring level over the substrate.

7. The method of claim 1, wherein the substrate comprises a bulk semiconductor substrate, and the forming the resistor comprises:

forming a trench in a top surface of the bulk semiconductor substrate;

filling the trench with insulator material; and forming a polysilicon resistor on the insulator material.

8. The method of claim 1, wherein the substrate comprises a bulk semiconductor substrate, and the forming the resistor comprises:

forming a layer of gate dielectric material on a top surface of the bulk semiconductor substrate;

forming a polysilicon resistor on the layer of gate dielectric material.

9. The method of claim 1, further comprising forming a heat sink over the central portion of the resistor.

10. The method of claim 9, further comprising forming at least one heat sink contact extending from the heat sink to the substrate.

11. The method of claim 1, further comprising:

forming at least one silicide contact on the resistor, wherein the at least one silicide contact directly contacts one of the at least one first contact and the at least one second contact; and forming silicide on the at least one extension.

12. The method of claim 11, further comprising forming a blocking structure between the at least one silicide contact and the silicide on the at least one extension, such that the silicide on the at least one extension does not directly contact the at least one silicide contact.

13. The method of claim 1, wherein:

the at least one extension comprises a wrap around portion that wraps around an end of the central portion of the resistor; and there is a gap between the wrap around portion and the central portion of the resistor.

14. The method of claim 1, wherein the at least one extension is formed in a same plane as the central portion of the resistor.

15. The method of claim 1, wherein the thermal diffusivity of the resistor material is calculated based on a thermal conductivity of the resistor material, a mass density of the resistor material, and a heat capacity of the resistor material.

16. The method of claim 15, wherein the sizing the at least one extension comprises sizing the at least one extension based on the thermal diffusion length of the resistor, a thermal diffusion length of the insulator layer, and a thickness of the insulator layer.

17. The method of claim 16, wherein the insulator layer comprises an insulator material and the thermal diffusion length of the insulator layer is calculated based on a thermal diffusivity of the insulator material.

18. A method of fabricating a semiconductor structure, comprising:

forming a resistor over an insulator layer over a substrate;

forming a first silicide contact at a first location on the resistor;

forming a second silicide contact at a second location on the resistor;

forming a first contact over and contacting the first silicide contact;

forming a second contact over and contacting the second silicide contact;

forming a first interconnect over and contacting the first contact; and forming a second interconnect over and contacting the second contact;

wherein the second location is different than the first location and the resistor is structured and arranged such that current flows from the first contact to the second contact through a central portion of the resistor;

the resistor comprises extensions extending laterally outward from the central portion in a direction parallel to the current flow; and the extensions are formed in a same plane as the central portion.

19. The method of claim 18, wherein the forming the resistor comprises sizing the at least one extension based on a thermal diffusion length of the resistor, a thermal diffusion length of the insulator layer, and a thickness of the insulator layer.

* * * * *